United States Patent [19]

Vermilyea

[11] Patent Number: 4,876,413

[45] Date of Patent: Oct. 24, 1989

[54] EFFICIENT THERMAL JOINTS FOR CONNECTING CURRENT LEADS TO A CRYOCOOLER

[75] Inventor: Mark E. Vermilyea, Schenectady, N.Y.

[73] Assignee: General Electric Company, Schenectady, N.Y.

[21] Appl. No.: 215,131

[22] Filed: Jul. 5, 1988

[51] Int. Cl.[4] ............................................. F25B 19/00
[52] U.S. Cl. ..................................... 174/15.4; 62/51.1
[58] Field of Search .............. 174/15.4, 85; 62/514 R; 335/216

[56] References Cited

U.S. PATENT DOCUMENTS

| | | | |
|---|---|---|---|
| 4,633,682 | 1/1987 | Laskaris | 62/514 R |
| 4,667,486 | 5/1987 | Miller et al. | 62/514 R |

Primary Examiner—Laramie E. Askin
Attorney, Agent, or Firm—William H. Steinberg; James C. Davis, Jr.; Paul R. Webb, II

[57] ABSTRACT

A thermally efficient electrically insulating joint operable at liquid nitrogen temperatures and below is provided for connecting a current lead to a cryocooler heat station. The joint includes clamping means, two indium sheets and a ceramic spacer. The ceramic spacer material can be either beryllia or alumina. The spacer has two faces situated opposite one another. Each of the indium sheets contacts a respective one of the faces. The ceramic spacer with the indium sheets on either side is situated between the current lead and the cryocooler heat station. The clamp means urge the cryocooler heat station and the lead together with sufficient force to cause the indium layers to conform to the surface with which they are in contact.

1 Claim, 3 Drawing Sheets 4,876,413

EFFICIENT THERMAL JOINTS FOR CONNECTING CURRENT LEADS TO A CRYOCOOLER

CROSS REFERENCE TO RELATED APPLICATIONS

The present invention is related to copending applications: Ceramic Superconductor Cryogenic Current Lead, Serial No. 215,113; Superconductive Magnetic Resonance Magnet Without Cryogens, Serial No. 215,165; Cryocooler Cold Head Interface Receptacle, Serial No. 215,114; Low Thermal Conductance Support for a Radiation Shield in a MR Magnet, Serial No. 215,111; Cable Suspension System for Cylindrical Cryogenic Vessels, Serial No, 215,477; and A Superconductive Quench Protected Magnet Coil, Serial No. 215,479, all filed July 5, 1988.

BACKGROUND OF THE INVENTION

The present invention relates to an electrically insulating thermal joint which provides electrical insulation while transferring heat across the joint with a minimum temperature difference across the joint.

In a superconducting magnet which operates without consumable cryogens, helium cooling is not available to reduce conduction heat transfer to the superconducting magnet from the ambient environment and to dissipate the resistance heating of the metallic resistive conductors. A magnet cryostat equipped with a recondensor or cryocooler permits no loss of helium since they operate as a closed loop system. Thermal losses of conventional permanently attached metallic leads usually handled by escaping helium vapor cannot be tolerated for long in a system having a recondensor, a cryocooler and no consumable cryogens. All heat carried to the magnet in the cryostat by radiation and conduction must be removed by the cryocooler so that the heat does not raise the magnet temperature above the transition temperature of the superconductor.

In a magnet configuration having superconductor windings and resistive joints, permanently connected leads can be used to maintain current at a constant value. Permanently connected leads, however, carry heat into the magnet due to heat conduction from higher temperatures and heat generated due to the resistance of the leads.

The cooling stations of the cryocooler can be used to remove heat from the leads but the leads have to be electrically isolated from the cryocooler and one another while still having a sufficiently high thermal conductivity so that heat transferred down the leads can be intercepted before it reaches the magnet.

It is an object of the present invention to provide a joint between a lead and a cryocooler heat station which will electrically insulate the leads from the cryocooler heat station while transferring heat from the leads to the interface with a minimal temperature difference across the joint.

SUMMARY OF THE INVENTION

In one aspect of the present invention a thermally efficient electrically insulating joint operable at liquid nitrogen temperatures and below is provided for connecting a current lead to a cryocooler heat station. The joint includes clamping means, to indium sheets and a ceramic spacer. The ceramic spacer material can be either beryllia or alumina. The spacer has two faces situated opposite one another. Each of the indium sheets contacts a respective one of the faces. The ceramic spacer with the indium sheets on either side is situated between the current lead and the cryocooler heat station. The clamp means urge the cryocooler heat station and the lead together with sufficient force to cause the indium layers to conform to the surface with which they are in contact.

BRIEF DESCRIPTION OF THE DRAWING

The subject matter which is regarded as the invention is particularly pointed out and distinctly claimed in the concluding portion of the specification. The invention, however, both as to organization and method of practice, together with further objects and advantages thereof, may best be understood by reference to the following description taken in conjunction with the accompanying drawing figures in which:

FIG. 1B shows the cryocooler completely engaged with the heat stations of the interface and FIG. 1A shows the cryocooler before final engagement of the interface receptacle with the cryocooler stages;

DETAILED DESCRIPTION OF THE INVENTION

Figures 1A, 1B:
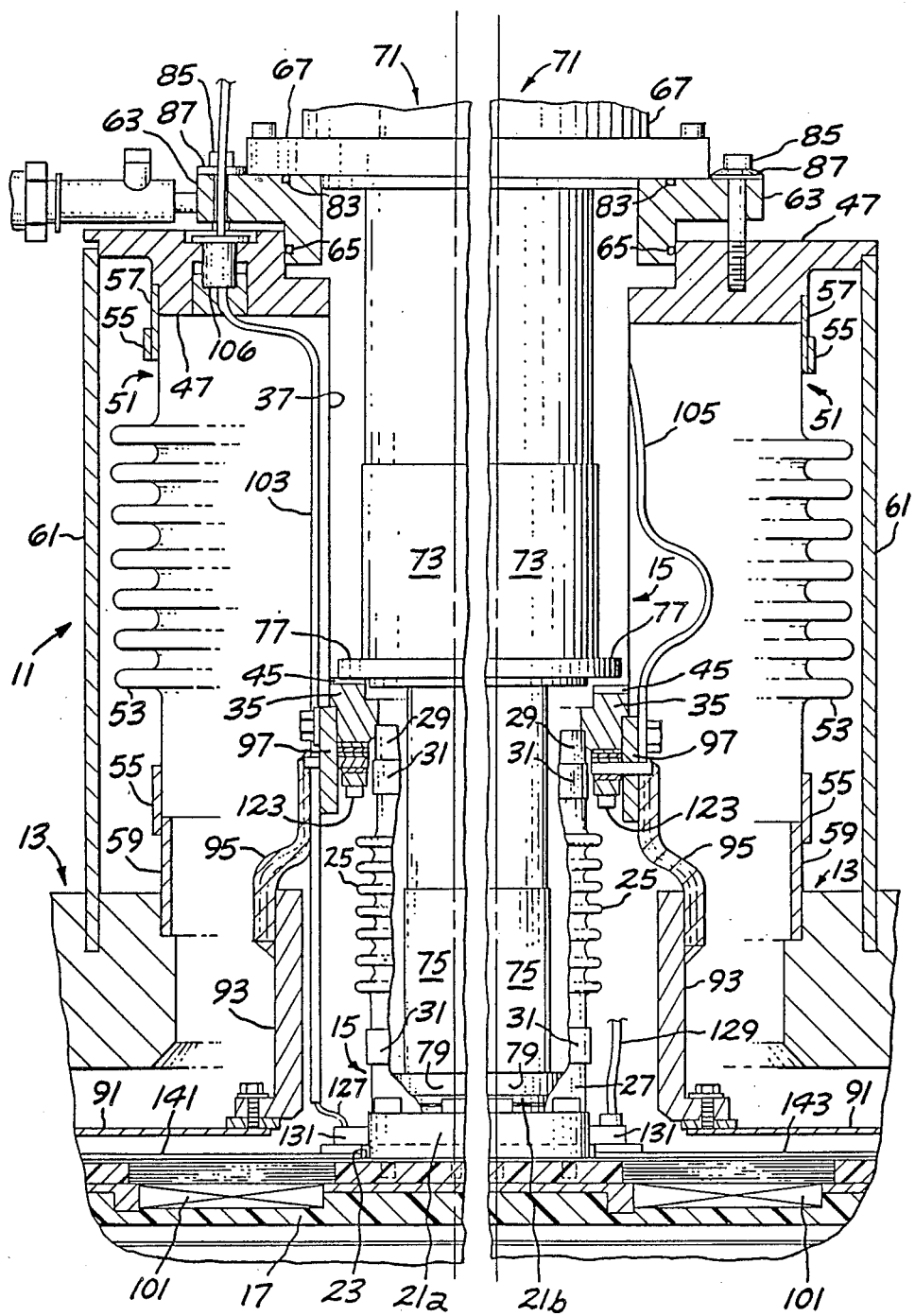
FIGS. 1A and 1B are partial side views of a typical cryocooler with an interface receptacle having permanently connected leads connected to the cryocooler head stationing through a thermal joint in accordance with the present invention. The side view is split approximately along the center line of the cryocooler cold head to show on the right FIG. 1A and on the left FIG. 1B.
Figure 2:
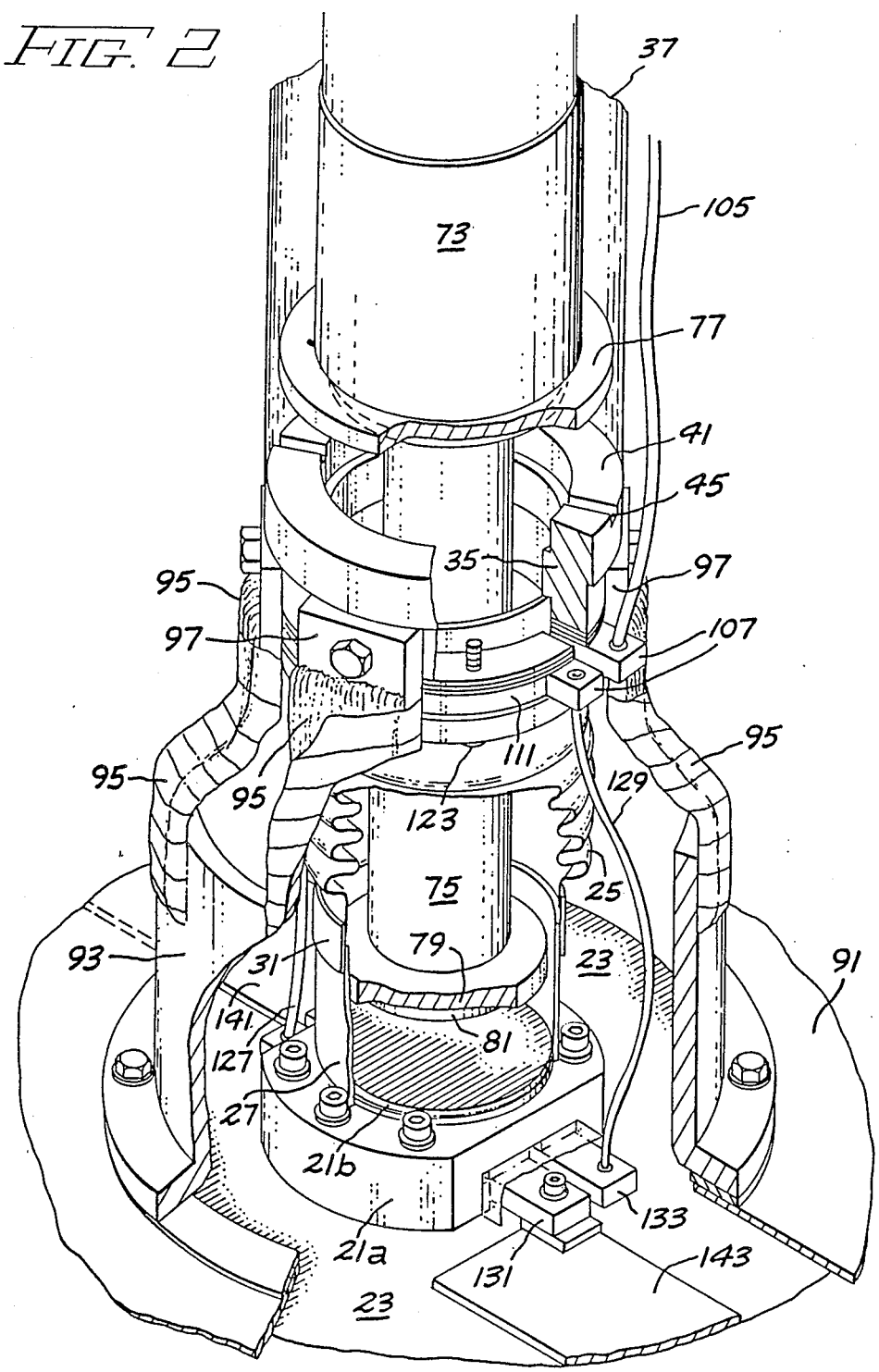
FIG. 2 is a partially cutaway isometric view of the interior portion of the cryocooler interface receptacle with the cryocooler cold head shown partially withdrawn.

Referring now to the drawing wherein like numerals indicate like elements throughout and particularly FIGS. 1A and 1B and FIG. 2, a cryocooler cold head receptacle 11 is shown attached to a cryostat 13. The receptacle comprises an inner sleeve 15 which is closed at one end. The closed end extends through an opening in the cryostat and rests on a support in the cryostat. In the present embodiment, the support comprises a copper enclosed winding form 17. The winding form is supported from the outer cryostat housing by a suspension (not shown). The inner sleeve 15 is fabricated in several sections. The closed end comprises a single piece of copper having first and second diameter cylinders 21a and 21b, respectively, each with its center lying on the same axial centerline. The smaller diameter portion 21b of the cylinder is airtightly secured to the sleeve 15. In the present embodiment the copper cylinder is oven brazed in a hydrogen atmosphere to one end of the stainless steel sleeve 15 to form an airtight connection. The larger diameter cylinder 21a is bolted through the copper shield 23 of the winding form 17. To provide axial flexibility to the sleeve 15, a stainless steel bellows section 25 is joined between section 27 and section 29 of the inner sleeve by means of stainless steel bands 31 which are welded in place over the ends of the bellows 25 and the ends of the two sections 27 and 29. Section 29 is brazed to the inner perimeter of a copper ring-shaped first stage heat exchanger 35 which forms a portion of the sleeve wall. The exterior of the ring 35 has six equally spaced flats. The upper portion of the sleeve 37 is joined to the outer diameter of the ring 35 creating a circular face 41 inside the sleeve visible in FIG. 2. The circular face has two slots 45 to allow flow communication between the upper and lower portions of the inner sleeve 15. The upper portion of the sleeve 37 terminates in the inner perimeter of a first stainless steel flange 47 having a central aperture.

An outer sleeve 51 having an axially flexible section, shown as a stainless steel bellows 53, is connected by welded bands 55 to stainless steel sleeve sections 57 and 59 which are secured by welding to the first flange 47 and the outer perimeter of the cryostat housing 13. The outer 51 and inner sleeves 15 together with the first flange 47 make an airtight seal of the cryostat opening. To limit travel of the first flange 47 towards the cryostat 13 when the cryostat is evacuated, a split collar 61 fits in a groove in the cryostat and engages the periphery of the first flange 47 when the sleeve compresses axially towards the cryostat. The split collar 61 is shown surrounding the outer sleeve 51 but can alternatively be positioned between the inner and outer sleeves 51 and 15, respectively.

A second flange 63 having a central aperture is situated inside the aperture of the first flange 47 with an "O" ring 65 allowing an airtight axially sliding fit. A flange 67 on cryocooler 71 is secured to the second flange 63 with the cold end of the cryocooler including the two cooling stages 73 and 75 extending into the inner sleeve 15. The two stages operate at two different temperatures below room temperature with the second stage 75 being colder than the first stage 73. The exact temperatures at the stages depend upon the heat load imposed, but the heat stations typically operate at 50K and 10K, respectively. The two stages 73 and 75 of the cryocooler cold end each have a generally cylindrical shape and lie along the same axial axis. The second stage 75 has a smaller diameter than the first stage and extends therefrom first. The first stage 73 terminates in a disk shaped heat exchanger 77 having a central aperture through which the second stage extends. The second stage terminates in a disk shaped heat exchanger 79. The second stage end of the cryocooler contacts the copper cylinder 21b which closes off the end of the inner sleeve 15. A thin sheet 81 of indium assures good thermal contact between disc 79 and cylinder 21b.

An "O" ring 83 is provided between the cryocooler flange 67 and the second flange 63 to assure a hermetic seal so that the inner sleeve 15 can be evacuated when the cryocooler 71 is in place. Adjustment means are provided to move the second flange axially relative to the first flange. In the present embodiment a ring of bolts 85 with Belleville washers 87 are shown joining the first and second flanges 63 and 47. The washers 87 are selected to flatten at a predetermined pressure. Tightening the bolts 85 until the washers 87 flatten exerts a predetermined force between the flanges. Alternatively, hydraulic clamp means (not shown) can be used to move the flanges axially relative to one another with a predetermined fluid pressure in the hydraulic line resulting in a predetermined force being exerted.

With the first flange 47 contacting the split collar 61 due to the evacuation of the cryostat 13, and the cryocooler 71 bolted to the second flange 63, the length of the inner sleeve 15 and the cold end of the cryocooler are such that the distance the second flange 63 can move towards the first flange 47 is greater than the space between the first stage heat exchanger 77 of the cryocooler and the surface 41 on the ring 35 against which it seats.

In order to remove heat from shield 91 which is spaced away from winding form 17 and encloses it, in cryostat 13, a collar 93 of low emissivity material such as copper extends from the shield and surrounds the second stage portion of the inner sleeve 15 which encloses cooling stage 75 of the cryocooler reducing radiation losses between the 10K cooled surfaces and the cryostat housing 13. The collar 93 is affixed to ring 35, which operates as a first stage interface heat exchanger, by six pieces of copper braid 95 circumferentially spaced about the collar and welded thereto. The other ends of each of the braids extend to separate blocks 97 to which they are welded. The blocks are bolted to the flats on the perimeter of heat exchanger ring 35. The braid 95 permits movement between the inner sleeve 15 and the collar 93 which occurs due to thermal contraction and due to loosening and tightening of bolts 85. Heat transfer between the second stage cryocooler heat station and the shield 23 directly surrounding the winding form having magnet windings 101 is accomplished by copper cylinder 21a being directly bolted to the copper shield 23. The cylinder 21b which closes the end of the inner sleeve is formed from the same piece of copper as the portion which is bolted to the shield 23. Thin indium sheet 81 visible in FIG. 2 and situated between the end of the cryocooler second stage heat station and the end of the cylinder 21b assures good heat transfer.

Figure 3:
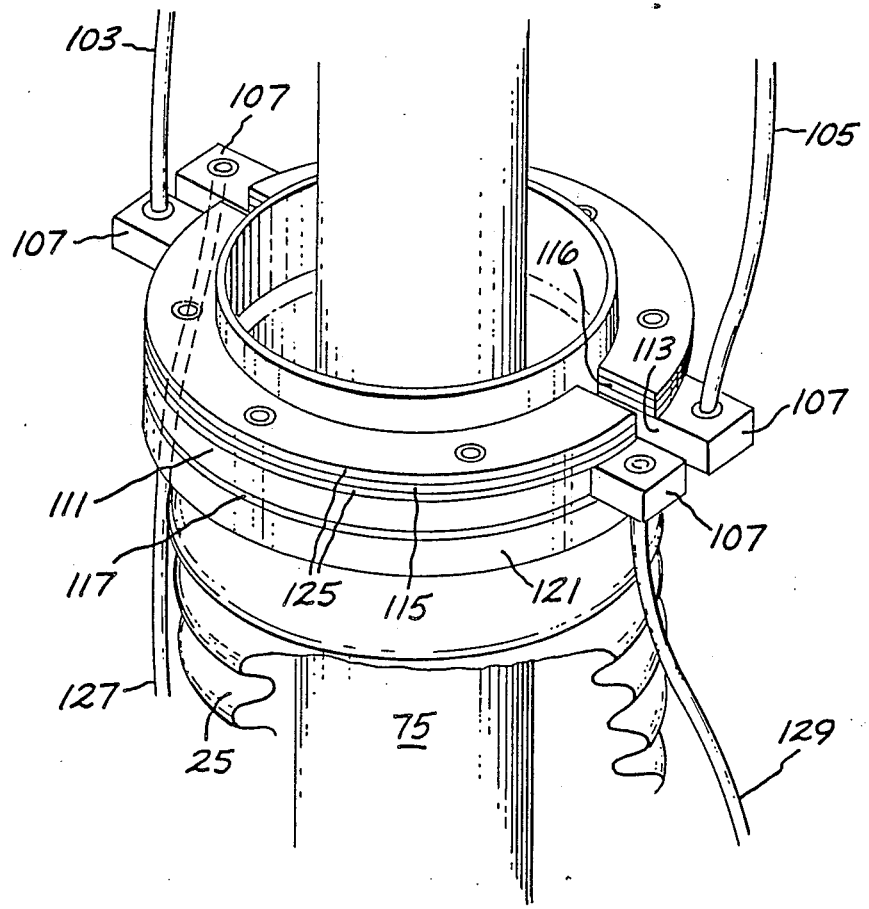
FIG. 3 is an isometric view of the thermal joint between the bus bar and the first stage heat exchanger in the inner sleeve of the cryocooler interface.

Permanently attached resistive leads 103 and 105 extend from the outside of the interface through insulated fittings 106 on the first flange to the interior of the second sleeve 51. The penetration is made airtight. The incoming leads are affixed to tabs 107 extending from two semicircular copper buses 111 and 113, most easily seen in FIGS. 2 and 3. Tabs 107 extend radially from either end of each of the semicircular buses. The semicircular buses 111 and 113 are bolted to the bottom of the heat exchanger ring 35 together with electrical insulators 115 and 116 separating the copper buses 111 and 113 and the ring, another electrical insulator 117 and a stainless steel ring 121 spreading the load of bolts 123. A layer of indium 125 is situated on either side of insulator 115 to assure a good thermal joint. Insulator 115 comprises alumina or beryllia ceramic. Beryllia is preferred because of its greater heat conductivity. The insulator 115 can be used without any metallization. Alternatively, if the ceramic is metallized with copper or nickel on both sides, the metallized ceramic can be soldered between copper ring 25 and bus bars using a solder with a modulus of elasticity such as indium solder and a pressure joint is not required. The metallization can be applied by vapor deposition. The thickness of the metallization can be 1 mil or less. The ceramic separates the copper or nickel on both sides maintaining electrical isolation between the two surfaces. Typical thicknesses are about 30 mils for the ceramic and 5 mils for the directly bonded metal.

In the embodiment shown, the ceramic is not soldered, and bolts 123 extend through insulating sleeves to avoid electrically short circuiting the two semicircular copper buses together. The bolts are tightened to provide at least 300 psi between layers so that the indium layers 125 flow to assure good thermal conductivity between adjacent faces.

A second pair of leads 127 and 129 are soldered to the two remaining tabs 107 on each of the semicircular bus bars so that lead 127 is soldered to the same bus bar as lead 105 and lead 129 is soldered to the same bus bar as lead 103. Leads 127 and 129 are then connected to bus bars 131 and 133, respectively, which are situated in a slot in the cylinder 21a. The bus bars are bolted up into cylinder 21a. A ceramic insulator comprising beryllia or alumina ceramic with two thin sheets of indium on either side is placed between the bus bars and the cylinder. A stainless steel bar on each bus bar spreads the load of the bolts. The bolts create at least 300 psi between layers to allow the indium to flow to create a good thermal joint. The bus bars are separated from one another a distance sufficient to provide a 250 volt dielectric strength. The bus bars 131 and 133 are joined to the copper bus bars 141 and 143 on the magnet by a bolted joint.

At 77K, thermal conductance using joints of beryllia and alumina has been measured to be as good as 5 W/cm$^2$−K. Dielectric strength for these ceramics is better than the 250 volts required. In the first stage interface in one magnet design, the high temperature lead sections will expel 2.3 watts into the first stage of the cooler. The area available for heat transfer here is 12 square cm. The equation for temperature rise across a joint with thermal conductance h and area A transferring heat Q is $\Delta T = Q/(hA)$. Therefore, in order to maintain the temperature difference between the bus bar and the cooler less than 0.1K, a thermal conductance of at least 2 W/cm$^2$−K is required. The proposed joint design fulfills this requirement.

The same magnet design has a heat input to the magnet independent of the current leads of 0.4 W, and an area available for heat transfer from the magnet to the second stage of the cooler of 35 square cm. For a dismountable thermal joint, the best thermal conductance available at 77 K is about 1.8 W/cm$^2$−K. Therefore, assuming this value to be temperature independent, the temperature difference across this joint is 0.0063 K. Now, the heat leak down each resistive current lead is 0.31 watt. With the ceramic joint thermal conductance of 5 W/cm$^2$−K, only 9.8 square cm. of area will maintain the temperature rise across this joint at less than 0.0063 K. This much area is available, so the heat will indeed travel into the cooler rather than the magnet.

The interface can be installed in the cryostat by first welding the outer sleeve 51 to the cryostat opening with the outer sleeve welded to flange 47. The inner sleeve 15 is installed in the opening by first bolting the copper cylinder 21a to the magnet winding form 17 with the bus bars 131 and 133 already in place. Leads 127 and 129 are soldered in place. The shield collar 93 with the braided sections 95 welded to the collar and blocks 97 is bolted to shield 91. Leads 103 and 105 which pass through flange 47 are soldered to tabs 107.

In operation, the cryostat 13 is evacuated causing the outer sleeve 51 to contract axially with the first flange 47 supported by the split collar 61. The cold end of the cryocooler is inserted into the inner sleeve 15 and bolted to the second flange 63. The inner sleeve 15 is evacuated creating an atmospheric pneumatic force proportional to the diameter of "O" ring 65 exerted on the second stage cryocooler heat station 75 and the end of the copper cylinder 21b. When "O" ring 65 has a 5 inch diameter, for example, the resulting pressure is 134 psi between the second stage cryocooler heat station and copper cylinder 21b.

The relative position of the parts of this stage of assembly are as shown in FIG. 1A. Additional force is next applied to the interface by tightening bolts 85 until flange 47 is lifted from the split collar 61 transferring the pneumatic force of the atmosphere pressure on the outer bellows 53 to a downward force on the second stage cryocooler heat station which results in a total interface pressure of 468 psi when the outer sleeve has an effective diameter of 93/8 inches.

Further tightening of the bolts 85 continues to lift the 50K heat station 35 so that the pressure at the interface between the first stage cryocooler heat station 77 and heat station 35 is increased to at least 300 psi by further deflecting the Belleville washers 87. However, the 10K interface is relatively unaffected due to the low spring constant of the bellows 25 over the distances involved.

It will be recognized that the interface pressures may be adjusted by varying the diameter of the outer bellows 53 or "O" ring 65 and by varying spring constants of either or both bellows 25 and 53.

While the invention has been particularly shown and described with reference to an embodiment thereof, it will be understood by those skilled in the art that various changes in form and detail may be made without departing from the spirit and scope of the invention.

What is claimed is:

1. A thermally efficient, electrically insulating joint operable at liquid nitrogen temperatures and below connecting a current lead to a cryocooler heat station comprising:
   clamping means;
   two indium sheets;
   a ceramic spacer wherein said ceramic material is selected from the group consisting of alumina and beryllia, said spacer having two faces situated opposite one another, each one of said indium sheets contacting a respective one of said faces, said ceramic spacer with the indium sheets on either face situated between the current lead and the cryocooler heat station, said clamping means urging said cryocooler heat station and the lead together with sufficient force to cause said indium sheets to conform to the surfaces with which they are in contact.

* * * * *